(12) United States Patent
Keenan

(10) Patent No.: US 7,585,049 B2
(45) Date of Patent: Sep. 8, 2009

(54) METHOD OF MAKING AN INKJET PRINTHEAD

(75) Inventor: Phil Keenan, Lucan (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 304 days.

(21) Appl. No.: 11/041,990

(22) Filed: Jan. 26, 2005

(65) Prior Publication Data

US 2005/0179729 A1    Aug. 18, 2005

(30) Foreign Application Priority Data

Jan. 30, 2004    (GB) ................. 0401943.6

(51) Int. Cl.
    *B41J 2/15*    (2006.01)
    *B41J 2/045*    (2006.01)
(52) U.S. Cl. .......................... 347/40; 347/71
(58) Field of Classification Search .......... 347/40, 347/50, 71
    See application file for complete search history.

(56) References Cited

U.S. PATENT DOCUMENTS

| | | | | |
|---|---|---|---|---|
| 5,975,683 | A * | 11/1999 | Smith et al. | 347/55 |
| 6,332,669 | B1 * | 12/2001 | Kato et al. | 347/54 |
| 6,764,165 | B2 * | 7/2004 | Aschoff et al. | 347/50 |
| 6,766,817 | B2 | 7/2004 | Da Silva | |
| 2002/0047876 | A1 * | 4/2002 | Irinoda et al. | 347/55 |
| 2002/0140783 | A1 * | 10/2002 | Takahashi | 347/72 |
| 2003/0085961 | A1 | 5/2003 | Furuhata | |
| 2003/0156157 | A1 * | 8/2003 | Suzuki et al. | 347/50 |
| 2004/0017419 | A1 | 1/2004 | Lai et al. | |
| 2004/0032468 | A1 * | 2/2004 | Killmeier et al. | 347/85 |
| 2006/0132543 | A1 * | 6/2006 | Elrod et al. | 347/49 |

FOREIGN PATENT DOCUMENTS

| | | |
|---|---|---|
| EP | 0 289 347 | 11/1988 |
| EP | 1 029 677 | 8/2000 |
| JP | 2002240278 | 8/2002 |

OTHER PUBLICATIONS

European Search Report dated Mar. 8, 2007 based on Application No. 05100555.1.

* cited by examiner

*Primary Examiner*—Manish S Shah
*Assistant Examiner*—Sarah Al-Hashimi

(57) ABSTRACT

A method of making an inkjet printhead for surface mounting comprises providing a substrate 10 having a plurality of ink ejection elements and a plurality of electrical contacts 18 formed on a first surface, the contacts being connected to the ink ejection elements to allow selective energisation of the elements. A plurality of through-holes 26 are formed in the substrate each extending from the opposite surface of the substrate fully through the thickness of the substrate to meet the underside of a respective electrical contact 18 on the first surface. Each through-hole is substantially completely filled with a conductive material 36 by electroplating. Finally, a further plurality of electrical contacts (solder mounds) 38 are provided on the second surface of the substrate each in contact with the conductive material in a respective through-hole.

8 Claims, 8 Drawing Sheets

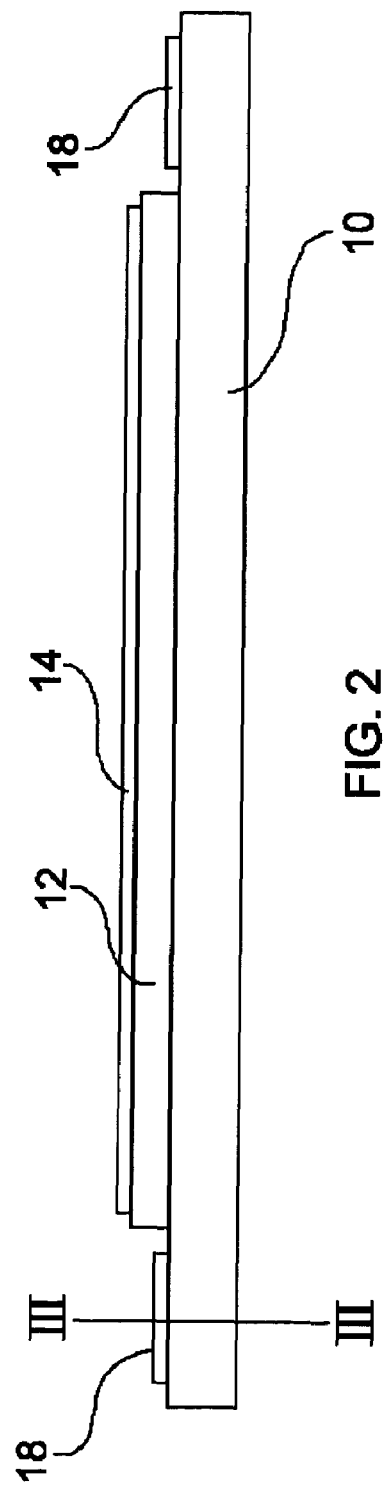
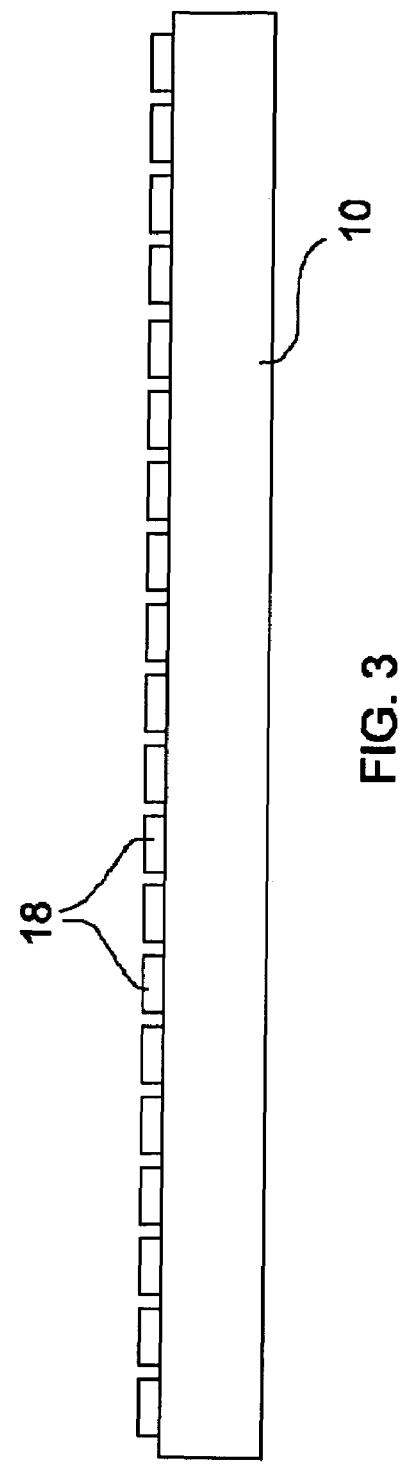

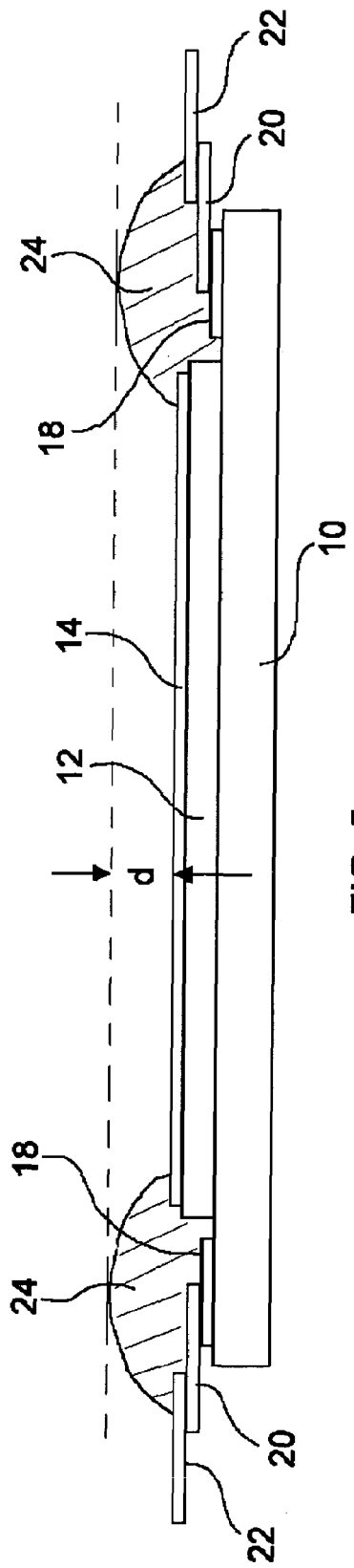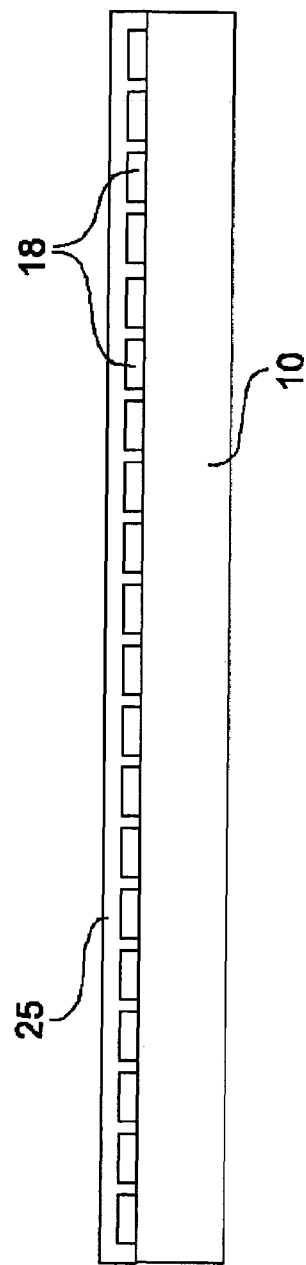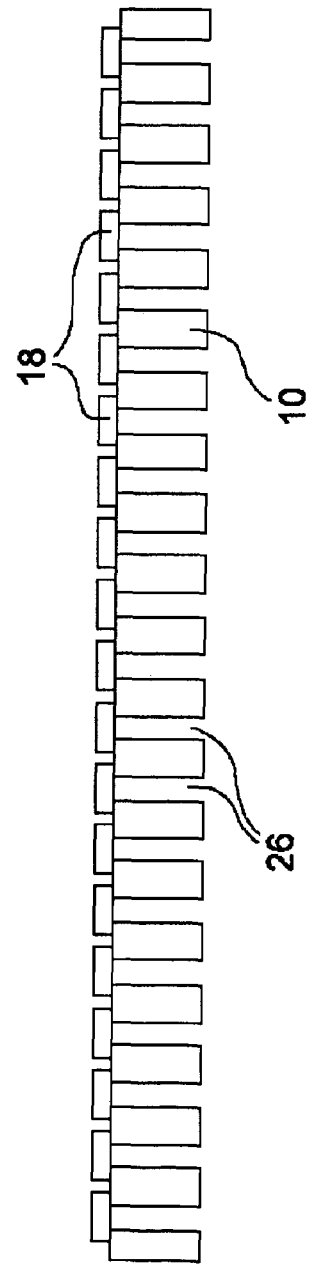
FIG. 5
FIG. 6
FIG. 7

METHOD OF MAKING AN INKJET PRINTHEAD

TECHNICAL FIELD

This invention relates to a method of making an inkjet printhead.

BACKGROUND ART

Conventional inkjet printers typically operate by ejecting small droplets of ink from individual orifices in an array of such orifices provided on a nozzle plate of a printhead. The printhead may form part of a print cartridge which can be moved relative to a sheet of paper and the timed ejection of droplets from particular orifices as the printhead and paper are relatively moved enables characters, images and other graphical material to be printed on the paper.

A typical conventional printhead is shown in FIGS. 1 to 5 which are, respectively, a simplified schematic plan view of a prior art inkjet printhead, a schematic cross-section of the printhead of FIG. 1 taken on the line II-II of FIG. 1, and a schematic cross-section of the printhead of FIG. 1 taken on the line III-III of FIG. 2. The printhead is fabricated on a silicon substrate 10 having thin film resistors deposited on its front surface, i.e. the surface facing the viewer in FIG. 1 and uppermost in FIGS. 2 and 3. The resistors are not visible in FIG. 1 due to the presence of an overlying nozzle plate 14 to be described. The resistors are arranged in an array relative to one or more ink supply slots (also not visible) in the substrate, and a layer of barrier material 12 is formed on the substrate around the resistors to isolate each resistor inside a respective thermal ejection chamber. The barrier layer 12 is shaped both to form the walls of the thermal ejection chambers and to provide an ink communication channel between each chamber and the ink supply slot. In this way, the thermal ejection chambers are filled by capillary action with ink from the ink supply slot, which itself is supplied with ink from an ink reservoir in the print cartridge of which the printhead ultimately forms part.

The composite assembly described above is typically capped by a nozzle plate 14, for example of nickel or polyimide. The nozzle plate has an array of orifices 16 which correspond to and overlie the ejection chambers so that each orifice is in register with a respective thin film resistor. The printhead is thus sealed by the nozzle plate 14, but permits ink flow from the print cartridge via the orifices 16 in the nozzle plate. In the illustrated example the orifices 16, and hence the underlying resistors, are disposed in three arrays, each array being in communication with a different coloured ink reservoir.

The thin film resistors are connected by thin film conductive traces to a plurality of electrical terminal pads 18 likewise deposited on the front surface of the substrate 10, typically in two rows arranged along opposite edges of the substrate 10 as seen in FIG. 1. These terminal pads 18 are exposed at the edges of the barrier layer 12 and, when the printhead is mounted on a print cartridge, they are connected via respective cantilevered flex beams 20, FIGS. 4 and 5, to corresponding traces on a flexible printed circuit 22 mounted on the print cartridge. Only the portion of the flexible printed circuit 22 in the immediate vicinity of the substrate 10 is shown in FIGS. 4 and 5. The terminal pads 18 are typically made of an aluminium-copper alloy and are gold plated to ensure a good electrical connection to the flex beams 20.

The flexible printed circuit 22 enables printer control circuitry located within the printer to selectively energise individual resistors under the control of software in known manner. When a resistor is energised it quickly heats up and superheats a small amount of the adjacent ink in the thermal ejection chamber. The superheated volume of ink expands due to explosive evaporation and this causes a droplet of ink above the expanding superheated ink to be ejected from the chamber via the associated orifice in the nozzle plate.

The two rows of terminal pads 18, together with their associated flex beams 20 and the adjacent edges of the nozzle plate 14 and printed circuit 22, are encapsulated in a UV cureable acrylic adhesive to avoid ink shorting due to ink ingress into the bond region. This cured adhesive forms ridges 24 above the level of the nozzle plate 14 and mandates a minimum distance d between the nozzle plate 14 and paper (indicated by the dashed line in FIG. 5).

The typical printhead described above is normally manufactured simultaneously with many similar such printheads on a large area silicon wafer which is only divided up into individual printhead dies at a late stage in the manufacture.

Many variations on this basic construction will be well known to the skilled person. For example, the number of arrays of orifices and ink ejection chambers provided on a given printhead may be varied, according to the number of differently coloured inks to be printed. The configurations of the ink supply slots, printed circuitry, barrier material and nozzle plate are open to many variations, as are the materials from which they are made and the manner of their manufacture.

The conventional printhead described above has certain disadvantages. The connections between the contact pads 18 and the flexible printed circuit 22 are usually made at the front surface of the substrate, as indicated in FIGS. 4 and 5. In practice this means that the print head has to be attached to the flexible circuit 22 before the flexible circuit is attached to the print cartridge body. Rework of this assembly is very difficult. Furthermore, the ridges 24 encroach on the nozzle plate to paper clearance, requiring their spacing to increase to reduce the risk of encapsulant-paper interference. This increase in spacing increases ink to paper trajectory errors, reducing print quality. In the case of printhead arrays, all interconnects take place on the nozzle side of the printhead, followed by encapsulation. It is likely that such printhead arrays would contain a percentage of defective printheads, and rework of an encapsulated array is very difficult.

U.S. Patent Application No. US2003/0082851 A1 describes a method of mounting a printhead die to a substrate by inserting upstanding conductive posts on the substrate through via holes in the die, and applying solder beads at the top ends of the posts. This is a complex and costly method which requires precise alignment of the posts with the via holes. Another technique described in the above US Patent Application uses via holes in the die whose internal walls are conductively plated. In this case a bevelled conductive cap is biased into the correspondingly bevelled upper end of the via hole, and a spring is biased into contact with the lower end of the via hole. This, too, is complex and costly technique.

It is therefore an object of the invention to provide an improved method of making an inkjet printhead in which, at least in certain embodiments, at least some of the disadvantages discussed above can be avoided or mitigated.

DISCLOSURE OF THE INVENTION

The invention provides a method of making an inkjet printhead comprising:
   providing a substrate having first and second opposite surfaces, forming a plurality of electrical contacts on the first surface of the substrate, forming a plurality of through-holes in the substrate each extending from the second surface of the substrate to meet the underside of a respective electrical contact on the first surface, and substantially filling each through-hole with a conductive material.

The invention has the advantage that cantilevered flex beams are not required to mount the printhead to a print cartridge body, so that the printhead can be mounted to the cartridge body as one of the final steps in the manufacturing process. Also, the contact pads do not need to be gold plated and, when mounted on the print cartridge body, any encapsulant employed does not need to extend significantly above the level of the nozzles. However, the invention does not need to make use of any or all of these advantages if it should be desirable in any particular embodiment.

As used herein, the terms "inkjet", "ink supply slot" and related terms are not to be construed as limiting the invention to devices in which the liquid to be ejected is an ink. The terminology is shorthand for this general technology for printing liquids on surfaces by thermal, piezo or other ejection from a printhead, and while one application is the printing of ink, the invention will also be applicable to printheads which deposit other liquids in like manner, for example, liquids intended to form conductors and resistors in miniature electrical circuits.

Furthermore, the method steps as set out herein and in the claims need not be carried out in the order stated, unless implied by necessity.

BRIEF DESCRIPTION OF THE DRAWINGS

FIG. 2 is a schematic cross-section of the printhead of FIG. 1 taken on the line II-II of FIG. 1;

FIG. 3 is a schematic cross-section of the printhead of FIG. 1 taken on the line III-III of FIG. 2;

FIG. 5 is a schematic cross-section of the attached printhead of FIG. 2;

FIGS. 6 to 11 show successive steps in making a printhead according to an embodiment of the invention;

Figure 1:
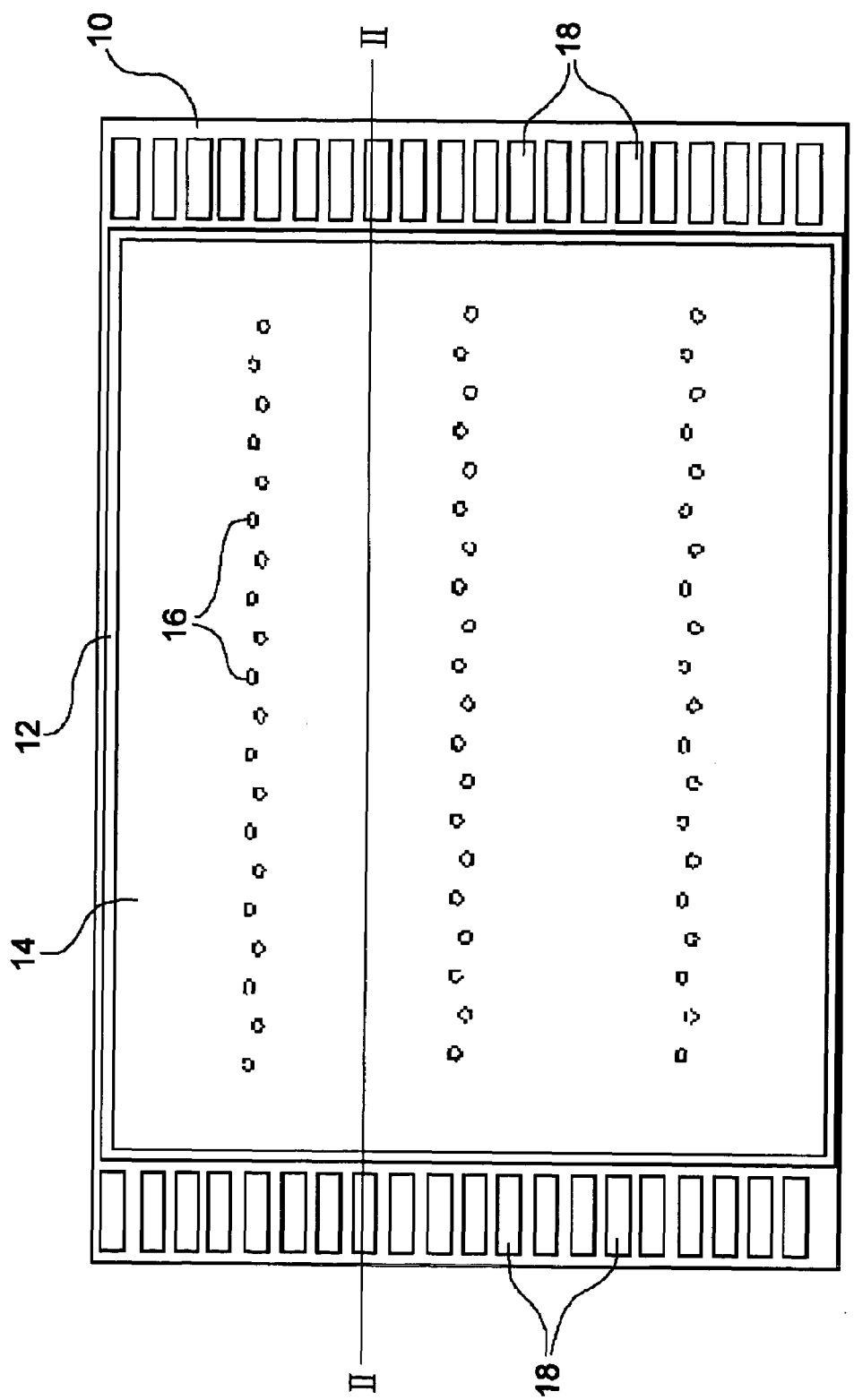
FIG. 1 is a simplified schematic plan view of a prior art inkjet printhead.
Figure 4:
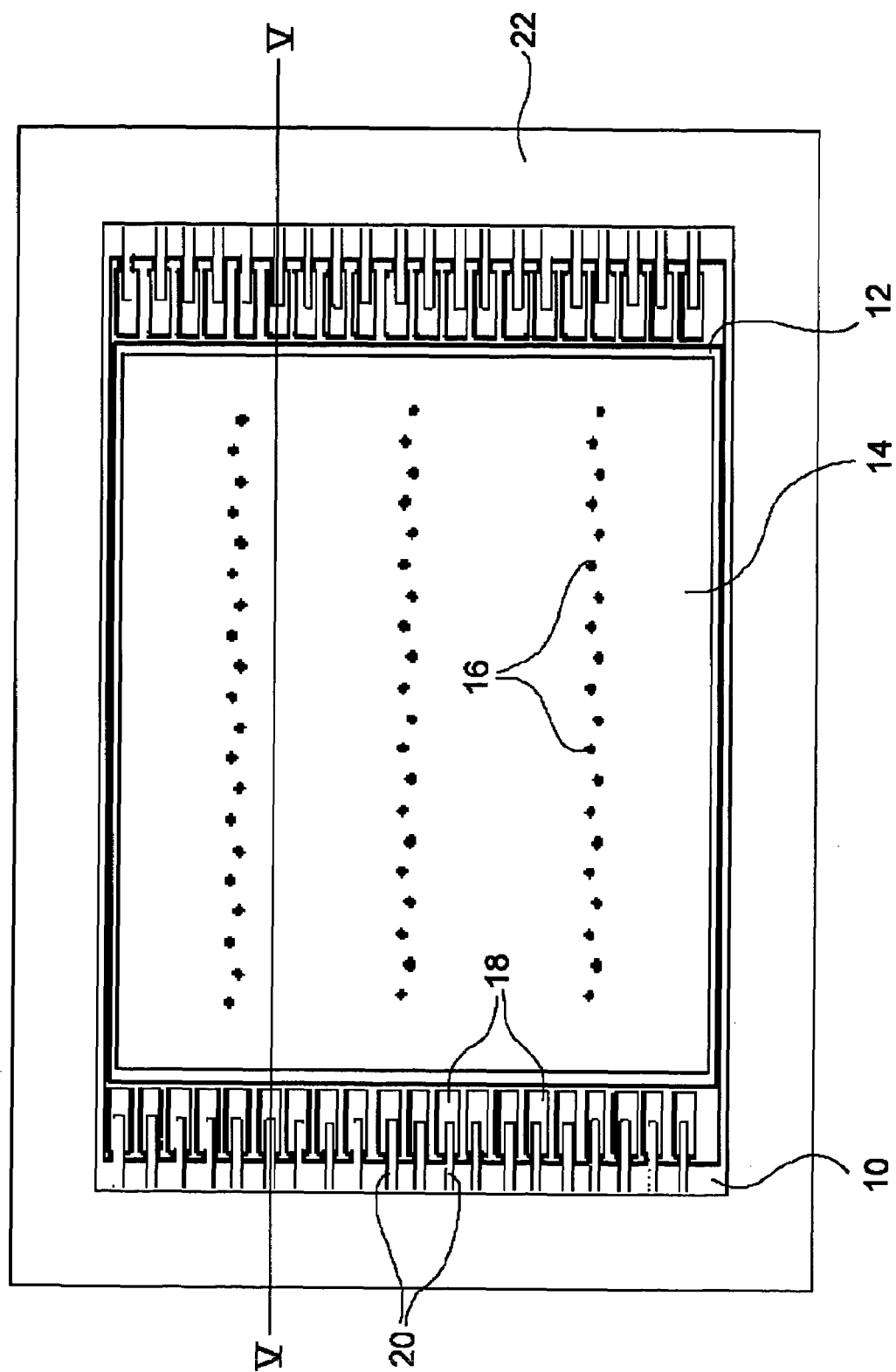
FIG. 4 is a simplified schematic plan view of the printhead of FIG. 1 attached to a flexible printed circuit.

In the drawings, which are not to scale, the same parts have been given the same reference numerals in the various figures. In addition, in the cross-sectional views of FIGS. 2, 5, 11 and 12 the internal details of the printhead, and in FIG. 12 also the cartridge body, which would normally be visible in such cross-sections, is omitted to avoid overcomplicating the drawings.

DESCRIPTION OF PREFERRED EMBODIMENT

In the embodiment of the invention now to be described with reference to FIGS. 6 to 10, the figures show a single printhead die for simplicity. However, the die is actually processed as an undivided part of a large area wafer containing a large number of such dies, and a reference to a process step carried out on the printhead die shown in the figures will be understood to refer to that process step carried out simultaneously on all printhead die regions of the wafer until the wafer is eventually subdivided into its individual printheads.

The first step in the manufacture of a printhead according to the embodiment of the invention is to process the front surface of the substrate in conventional manner to lay down the array of thin film heating resistors, the two rows of contact pads 18 and the thin film conductive traces connecting them, as previously described. However, it is not necessary to gold plate the aluminium-copper contact pads 18, unlike the conventional pad described above. At this stage a cross-section through one of the rows of contact pads 18 will look like FIG. 3, even though neither the barrier layer 12 nor nozzle plate 14 have yet been applied.

Now, FIG. 6, a blanket layer of a protective material 25 such as polyvinyl alcohol (PVA) or a water-soluble removable sol gel, for example as described in our co-pending application entitled "A Method of making an Inkjet Printhead" Ser. No. 11/041,989, is applied over the entire front surface of the substrate, covering all the thin film circuitry including the contact pads 18. The protective layer 25 is then soft baked.

Next, blind through-holes 26 having a diameter of about 50 microns are drilled through the silicon substrate 10, each through-hole 26 extending from the rear surface of the substrate fully through the thickness of the substrate to meet the underside of a respective aluminium-copper contact pad 18 on the front surface of the substrate. The through-holes 26 are formed using either deep reactive ion etching, wet-etching or a combination laser-wet etch process, techniques well-known to those skilled in the art.

The internal walls of the through-holes 26 are now metallized using a direct metallization treatment to line the surfaces of the through-hole. This may be achieved by first creating a seed layer of palladium on the inner walls by immersing the wafer in a bath of palladium chloride solution, then reducing the palladium by a solution of stannous chloride (Sn2+) to the metal palladium deposited on the silicon surfaces by the reaction:

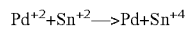

$$Pd^{+2}+Sn^{+2}\longrightarrow Pd+Sn^{+4}$$

A thin layer of copper is now grown on the surfaces of the silicon by immersing the wafer in a bath of electroless copper whereby the palladium sites act as a catalyst for the reduction of the copper to metal.

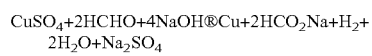

$$CuSO_4+2HCHO+4NaOH \textcircled{R} Cu+2HCO_2Na+H_2+ 2H_2O+Na_2SO_4$$

The metallization also coats the rear surface of the substrate, but this metallization is removed by polishing the rear surface to leave the conductive metal only on the internal walls of the through-holes 26. Then, using standard photoimaging, exposure and development techniques, the protective layer 25 is selectively removed from over the contact pads 18 while remaining over the thin film resistors and conductive traces. The result is shown in FIG. 7. It will be understood that, like FIG. 6, FIGS. 7 to 10 are vertical cross-sections taken along the row of contact pads 18, i.e. corresponding to the line III-III in FIG. 2, and therefore will not show detail behind the cross-section such as the protective layer 26 remaining on the substrate in FIG. 7.

Figure 8:
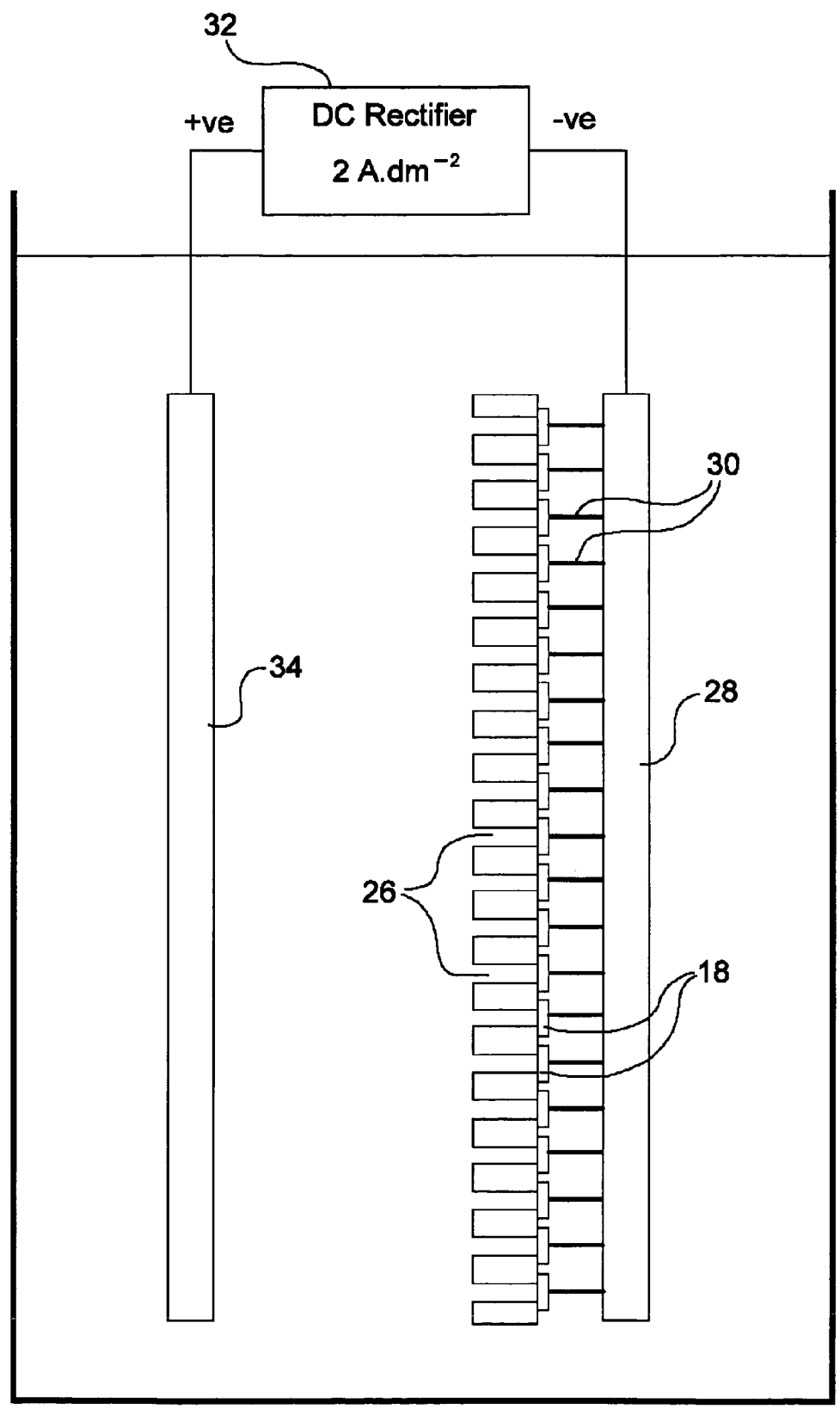

Next, FIG. 8, a wafer sized bus-bar 28 is connected to all the contact pads 18. The bus-bar is similar in construction to a wafer-prober, with individual spring-loaded contacts 30 that make electrical contact with each of the pads 18. The bus bar 28 is connected to the negative terminal of a DC rectifier 32 whose positive terminal is connected to an anode 34. The bus bar delivers a cathodic potential to the pads 18 and thus allows electrolytic plating to take place within the coated through-holes 26.

The wafer assembly is immersed in a commercial copper electroplating solution such as a Schlotter electrolytic cyanide copper solution and the through-holes 26 electroplated with copper at a current density of around 2 A per square decimetre. The holes will electroplate at around 0.9 microns of copper per minute, resulting in a 50 micron hole completely filling with copper in around 25 minutes. The alternative method of electroless plating is, by comparison, very slow and high-build electroless copper is unable to deposit copper at a rate much faster than 0.07 microns per minute, requiring around six hours per wafer to fill a 50 micron hole.

Figure 9:
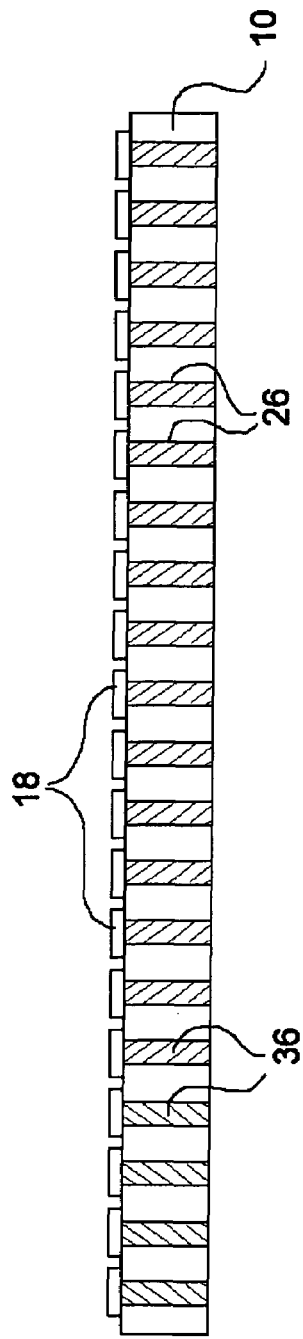

The plated printhead is shown in FIG. 9 where it is seen that each through-hole 26 is substantially completely filled with copper 36 to form a T-like junction with the underside of the respective contact pad 18. The T-junction offers superior through-hole conductor to thin-film contact pad bond strength due to the large contact area compared to through-holes that are machined all the way through the substrate and contact pad and then plated only on their interior walls. In the example of FIG. 9, the through-hole diameter is about 50 microns and the aluminium-copper contact pad thickness is about 0.5 microns.

Figure 10:
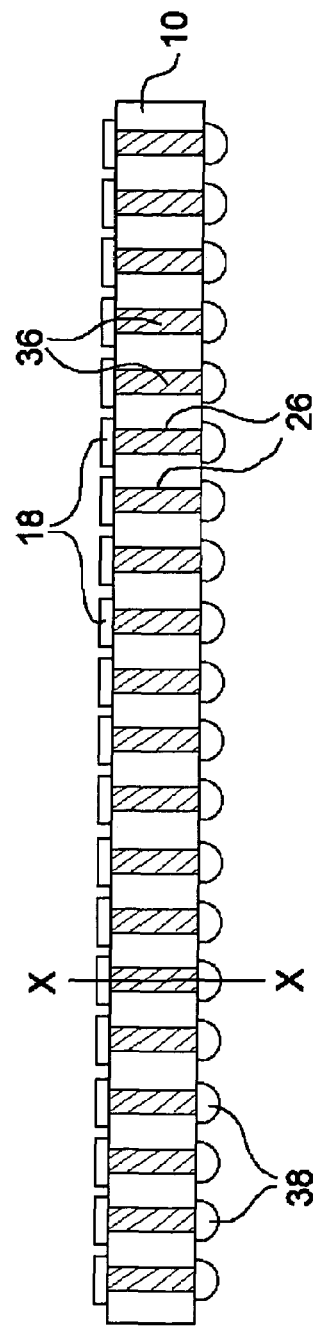

After completing the electroplating, solder mounds 38 are applied to the rear surface of the substrate, FIG. 10, each in contact with the copper 36 in a respective through-hole 26. Now the remainder of the protective coating 25 is removed from the front surface of the substrate to uncover the thin film heating resistors and conducting traces. Finally, the barrier layer 12, nozzle plate 14 and ink supply slots (not shown) may be formed in conventional manner as known to those skilled in the art and outlined in the introduction.

Figure 11:
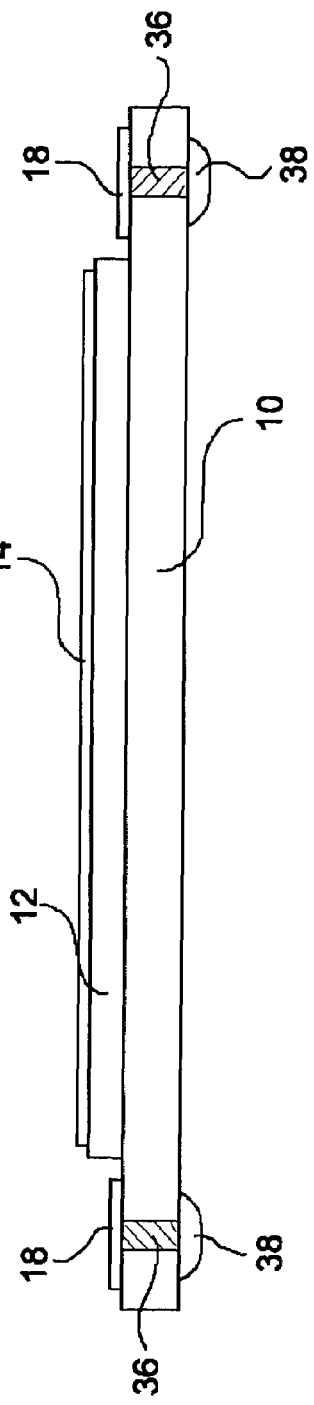

The individual printhead dies are now separated from the wafer in which they are formed. The final individual printhead die is shown in FIG. 11, which corresponds to a cross-section taken on the line X-X of FIG. 10.

Figure 12:
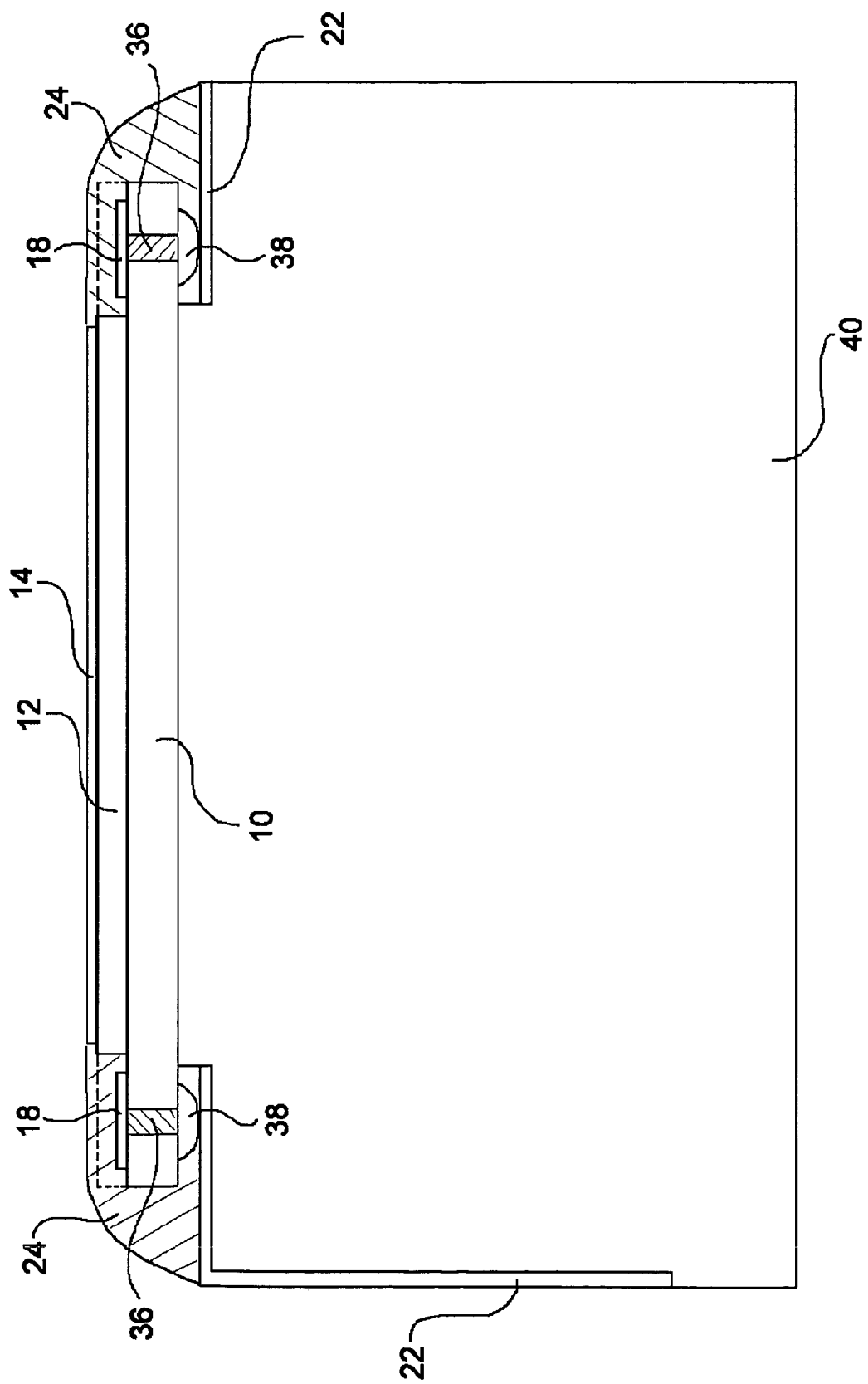
FIG. 12 is a schematic cross-sectional view of a print cartridge incorporating the printhead of FIG. 11.

The printhead is now ready to be surface-mounted onto a suitable substrate, for example a cartridge body 40, FIG. 12. In FIG. 12 the cartridge body 40 already has a flexible printed circuit 22 attached to it, and the solder mounds 38 on the printhead are directly connected to a set of conductive tracks on the printed circuit without the need for flex beams 20. The encapsulant 24 is still used, but although it covers the contact pads 18 and extends up to the edges of the barrier layer 12 and nozzle plate 14 it does not extend significantly above the latter. As seen in FIGS. 11 and 12, the barrier layer 12 does not cover the contact pads 18. This is conventional, since normally such pads are bonded to respective flex beams in the conventional printhead. However, in the present embodiment the connections are made from the rear surface of the substrate 10, via the solder mounds 38, so it is possible to allow the barrier layer 12 to cover the pads 18, as indicated by the dashed lines in FIG. 12. Although not shown, the body 40 has apertures in fluid communication with the ink supply slots in the substrate 10 for supplying ink from an ink reservoir in the cartridge body to the printhead in conventional manner.

Figure 13:
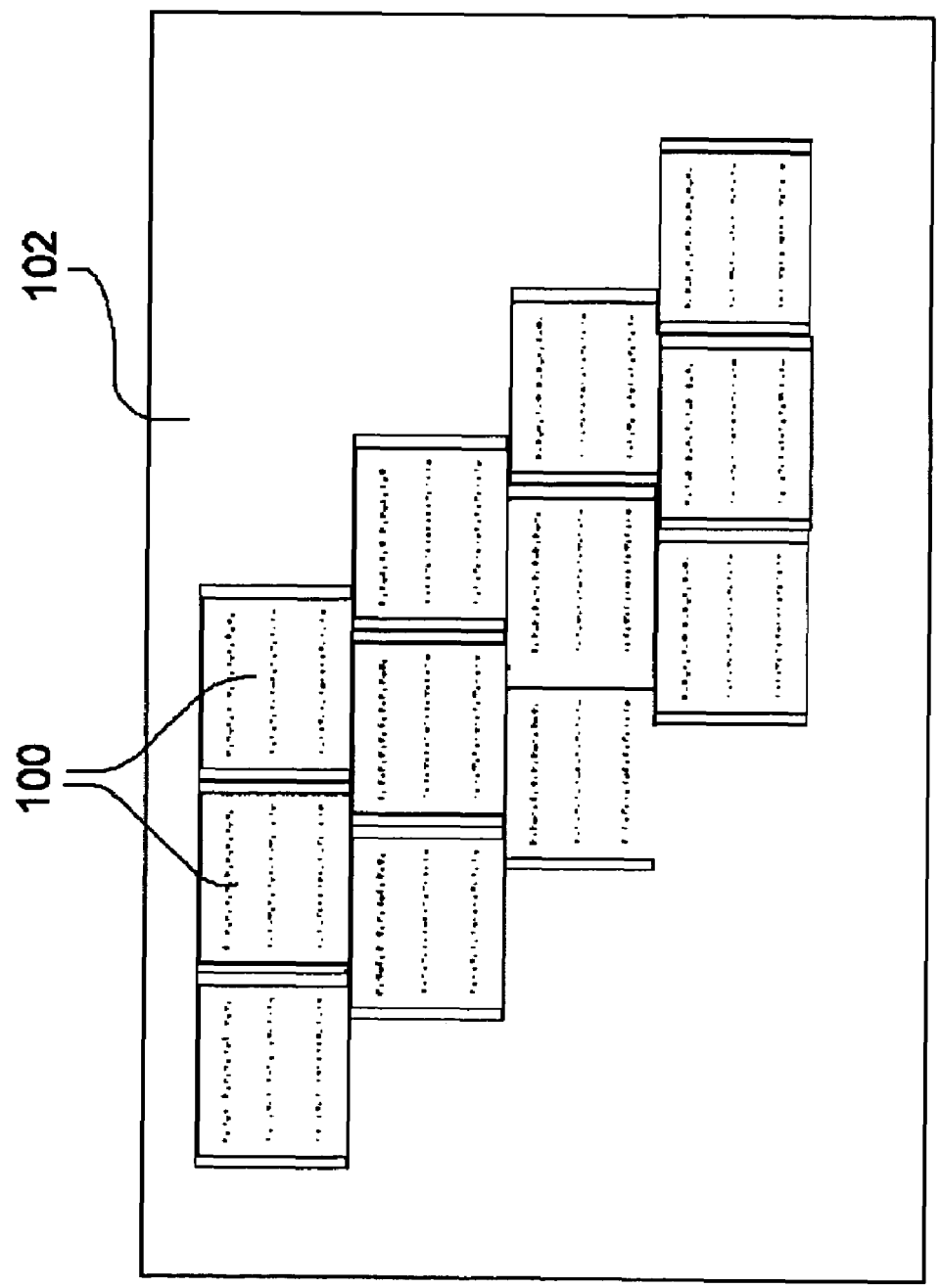
FIG. 13 shows an array of printheads of FIG. 11 surface mounted onto a circuit board.

Instead of mounting individual printheads to individual cartridge bodies, an array of printheads 100 made by the above method may be surface mounted onto a circuit board 102, FIG. 13. After completed printhead/printhead array testing, defective printheads may be readily removed by de-soldering the defective printhead from the array. This would be very difficult with conventional technology.

The invention is not limited to the embodiment described herein and may be modified or varied without departing from the scope of the invention.

What is claimed:

1. A printing device comprising a body and a printhead made by a method comprising:
   providing a substrate having first and second opposite surfaces;
   forming a plurality of electrical contacts on the first surface of the substrate;
   forming a plurality of through-holes in the substrate each extending from the second surface of the substrate to meet the underside of a respective electrical contact on the first surface;
   substantially filling each through-hole with a conductive material;
   providing a further plurality of electrical contacts on the second surface of the substrate each in contact with the conductive material in a respective through-hole;
   providing ink ejection elements that include a structure on the first substrate surface defining a plurality of ink ejection chambers and associated inkjet nozzles; and
   covering the first surface electrical contacts with an encapsulant which extends to the edge of the said structure but not significantly above said structure,
   wherein the printhead is surface mounted on the body.

2. A printing device as claimed in claim 1, wherein the body is a print cartridge body containing an ink supply for the printhead.

3. An inkjet printer including a printing device as claimed in claim 2.

4. A printing device as claimed in claim 1, wherein the body is a circuit board upon which a plurality of the said printheads are surface mounted.

5. An inkjet printer including a printing device as claimed in claim 4.

6. An inkjet printer including a printing device as claimed in claim 1.

7. A printing device as claimed in claim 1, wherein the structure includes a barrier layer, and wherein the barrier layer covers the plurality of electrical contacts on the first surface of the substrate.

8. A printing device comprising a body and a printhead made by a method comprising:
   providing a substrate having first and second opposite surfaces;
   forming a plurality of electrical contacts on the first surface of the substrate;
   forming a plurality of through-holes in the substrate each extending from the second surface of the substrate to meet the underside of a respective electrical contact on the first surface;
   substantially filling each through-hole with a conductive material;
   providing a further plurality of electrical contacts on the second surface of the substrate each in contact with the conductive material in a respective through-hole; and
   providing ink ejection elements that include a structure on the first substrate surface defining a plurality of ink ejection chambers and associated inkjet nozzles, and
   covering the first surface electrical contacts with an encapsulant which extends to the edge of the said structure but not significantly above said structure,
   wherein the printhead is surface mounted on the body, wherein the body is a print cartridge body containing an ink supply for the printhead and a flexible printed circuit.

* * * * *